(12) United States Patent
Ma

(10) Patent No.: US 7,014,489 B2
(45) Date of Patent: Mar. 21, 2006

(54) LAND GRID ARRAY CONNECTOR ASSEMBLY

(75) Inventor: Hao-Yun Ma, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/994,510

(22) Filed: Nov. 22, 2004

(65) Prior Publication Data

US 2005/0130477 A1    Jun. 16, 2005

(30) Foreign Application Priority Data

Nov. 27, 2003   (TW) ............................... 92220952 U

(51) Int. Cl.
*H01R 13/62*     (2006.01)
(52) U.S. Cl. ......................................... 439/331; 439/73
(58) Field of Classification Search ................ 439/331, 439/73
See application file for complete search history.

(56) References Cited

U.S. PATENT DOCUMENTS

| | | | |
|---|---|---|---|
| 6,485,320 B1 * | 11/2002 | Ma | 439/342 |
| 6,648,656 B1 * | 11/2003 | Ma | 439/73 |
| 6,692,279 B1 | 2/2004 | Ma | |
| 6,699,057 B1 * | 3/2004 | Ma | 439/342 |
| 6,716,050 B1 * | 4/2004 | Ma et al. | 439/331 |
| 6,722,909 B1 * | 4/2004 | McHugh et al. | 439/331 |

* cited by examiner

*Primary Examiner*—Tho D. Ta
*Assistant Examiner*—Vanessa Girardi
(74) *Attorney, Agent, or Firm*—Wei Te Chung

(57) ABSTRACT

An land grid array (LGA) connector assembly comprises an insulative frame, a plurality of contacts received in the insulative frame, a reinforcement covering a circumference of the insulative frame, a clip assembled on the reinforcement and a lever mounted to the reinforcement and engaging with the clip. The clip is formed with a pivotal portion pivotally assembled on the reinforcement. The pivotal portion has at least one stopping portion on a edge thereof, the stopping portion is extending towards the insulative frame and abuts against the insulative frame to prevent the clip from moving flatly when the clip is in a close position.

16 Claims, 6 Drawing Sheets

LAND GRID ARRAY CONNECTOR ASSEMBLY

BACKGROUND OF THE INVENTION

1. Field of the Invention

The present invention relates to land grid array (LGA) connector assembly, and particularly to an LGA connector assembly adapted for receiving an LGA central processing unit (CPU) therein and electrically connecting the CPU to a printed circuit board (PCB).

2. Description of Related Art

Referring to FIG. 5, a conventional LGA connector assembly 8 adapted for electrically connecting with an LGA CPU 100 comprises an insulating frame 82 receiving a plurality of contacts 81, a reinforcement 83 assembled on the insulative frame 82, a clip 84 and a lever 86 pivotally mounted to the reinforcement 83 respectively. The clip 84 has a pivotal portion 87 engaging with a latching portion 89 formed on the reinforcement 83, and the lever 86 has a driving portion 85 for pressing against the clip 84. During a rotating of the lever 86 towards the insulative frame 82, the driving portion 85 of the lever 86 brings the clip 84 pressing against the CPU 100, then the CPU 100 electrically connects with the contacts 81 received in the insulative flame 82.

Referring to FIG. 6, during the process of the clip 84 rotating from an open position to a close position relative to the insulative frame 82, the pivotal portion 87 of the clip 84 moves outwardly. When the driving portion 85 presses the clip 84, the clip 84 will be pulled toward the driving portion 85 because of the cooperation of the driving portion 85 and the clip 84. Another word, the cooperation between the clip 84 and the driving portion 85 will give a pulling force, by which the clip 84 will move toward the driving portion 85. If the clip 84 moves unduly, the CPU 100 is pushed to strike a sidewall of the insulative frame 82. That may cause that sidewall of the insulative frame 82 to be damaged or a pressing force of the clip 84 on the CPU 100 to be not enough, so that the contacts 81 especially the contacts 81 in the corner 88 can not contact with the CPU 100 reliably. And due to a friction between the CPU 100 and the sidewall of the insulative frame 82, the CPU 100 may not be in a right position which is needed in a normal working state, so that a pressing point and the pressing force of the clip 84 are not steady, that will influence a normal working of the CPU 100.

SUMMARY OF THE INVENTION

An object of the present invention is to provide a land grid array (LGA) connector assembly, which can get a well electrically connecting with a LGA central processing unit (CPU).

Another object of the present invention is to provide a LGA connector assembly, which can decrease a friction between the CPU and an insulative frame of the LGA connector.

A further object of the present invention is to provide a LGA connector assembly, which can prevent the CPU from being damaged due to excessive movement.

Accordingly, to achieve above-mentioned object, a land grid array (LGA) connector assembly in accordance with the present invention is adapted for electrically connecting with an LGA central processing unit (CPU), the LGA connector assembly comprises an insulative frame, a plurality of contacts received in the insulative frame, a reinforcement covering a circumference of the insulative frame, a clip assembled on the reinforcement and a lever mounted to the reinforcement and engaging with the clip. The clip is formed with a pivotal portion pivotally engaging with the reinforcement. The pivotal portion has at least one stopping portion on a edge thereof abutting against the insulative frame to prevent the clip from moving flatly.

The stopping portion of the clip can prevent the CPU from moving unduly, and decrease a friction between the CPU and a sidewall of the insulative frame near the lever. Such arrangement makes the CPU be pressed enough and ensures that the CPU will electrical contact with the contacts of the LGA connector assembly reliably. Furthermore, this arrangement can reform the problem that a pressing point and a pressing force of the clip are not steady.

The detailed features of the present invention will be apparent in the detailed description with appropriate reference to the accompanying drawings.

DETAILED DESCRIPTION OF THE INVENTION

Figure 1:
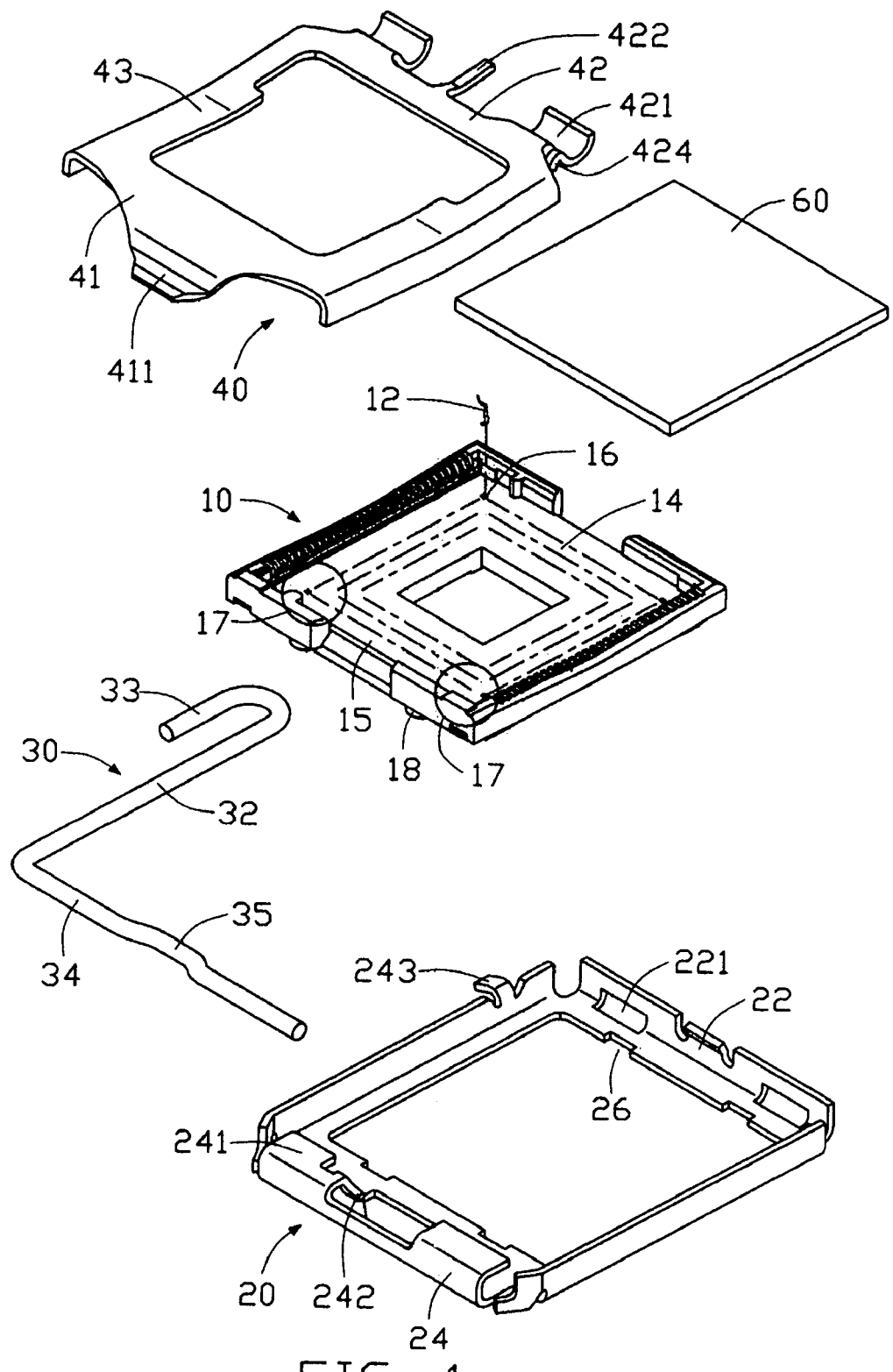
FIG. 1 is an exploded perspective view of a conventional land grid array (LGA) connector assembly and a LGA central processing unit (CPU)
Figure 2:
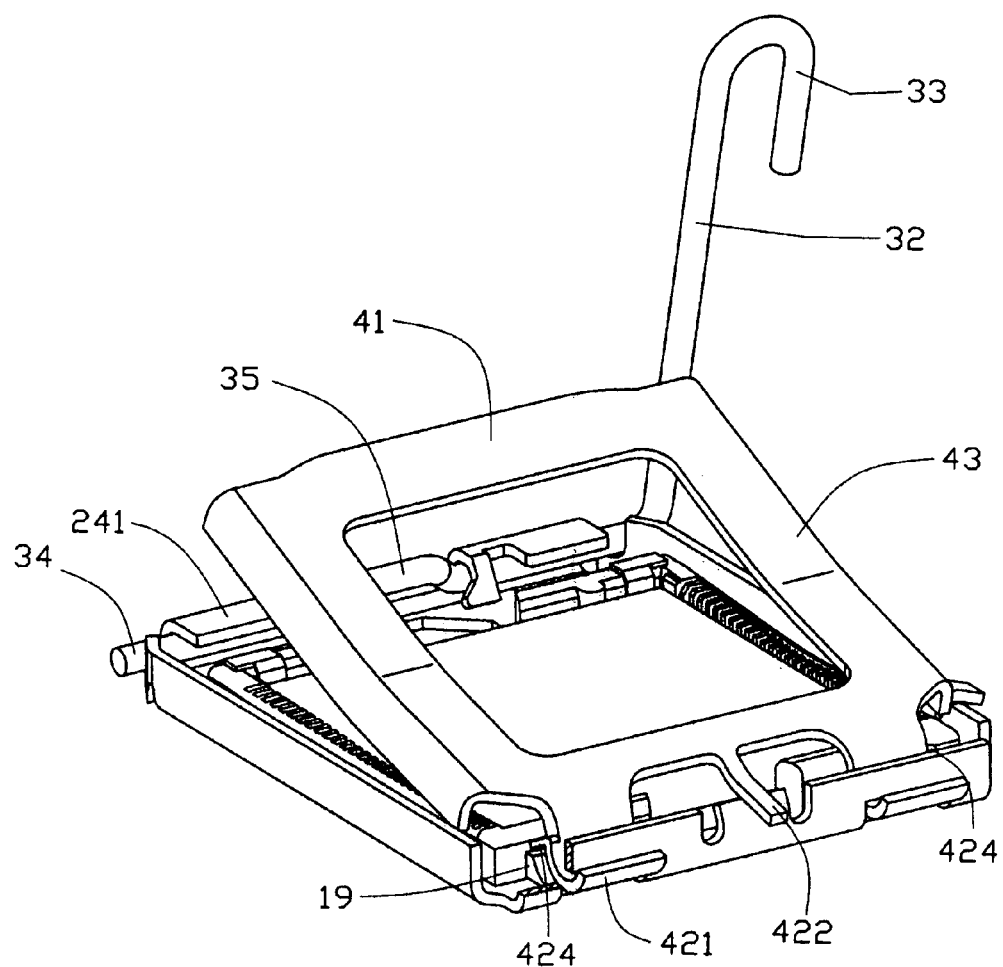
FIG. 2 is an assembled perspective view of the LGA connector assembly and the CPU of FIG. 1.
Figure 3:
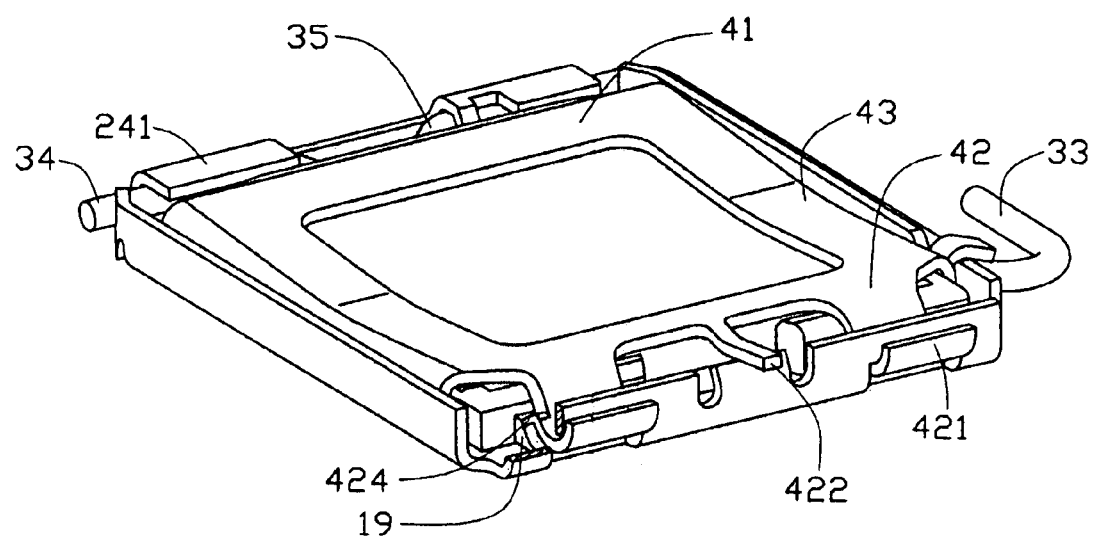
FIG. 3 is an exploded perspective view of an LGA connector assembly and the CPU in accordance with the present invention.
Figure 4:
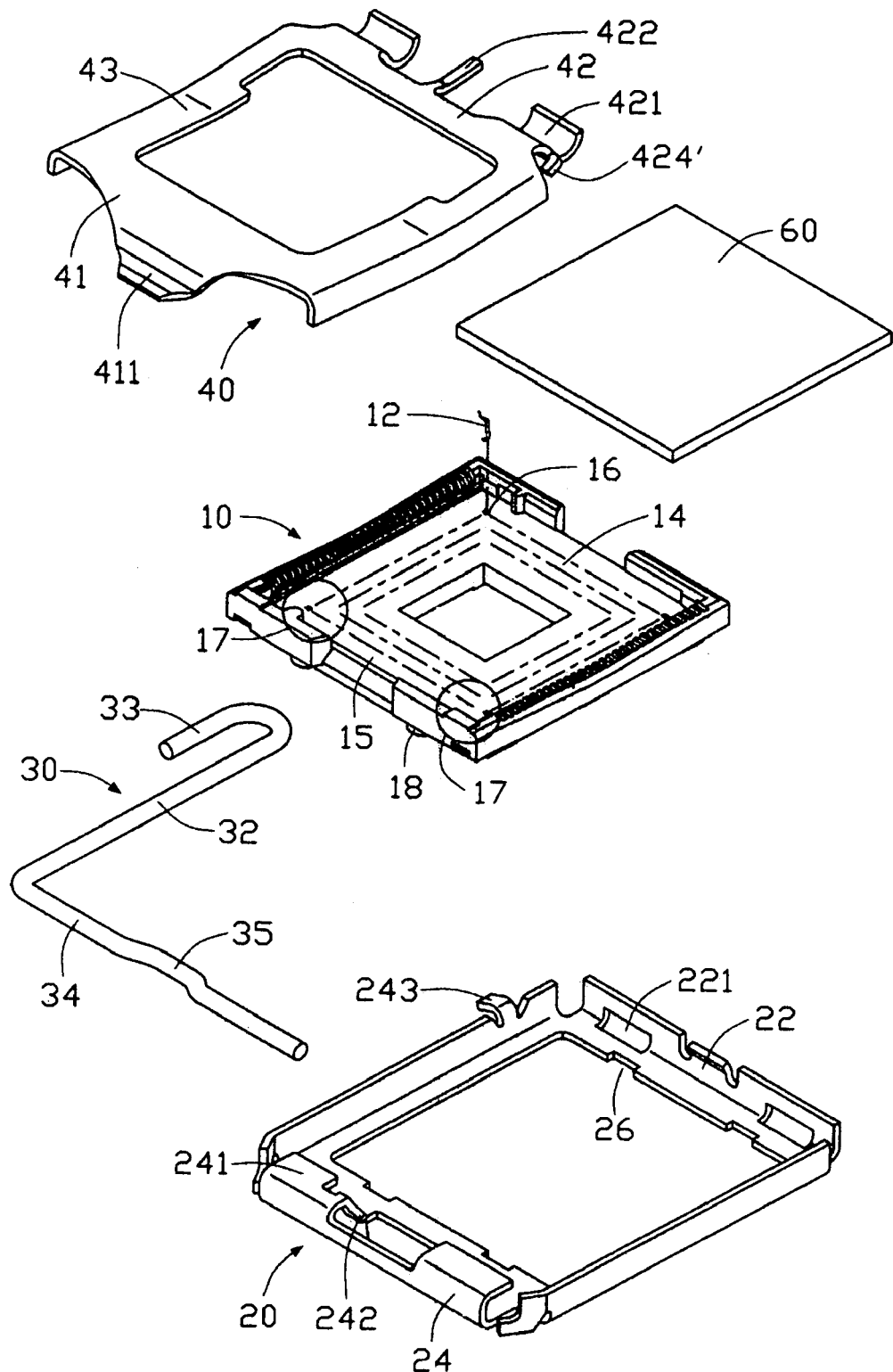
FIG. 4 is an assembled perspective view of the LGA connector assembly and the CPU of the FIG. 3, wherein the LGA connector assembly is in an open position.
Figure 5:
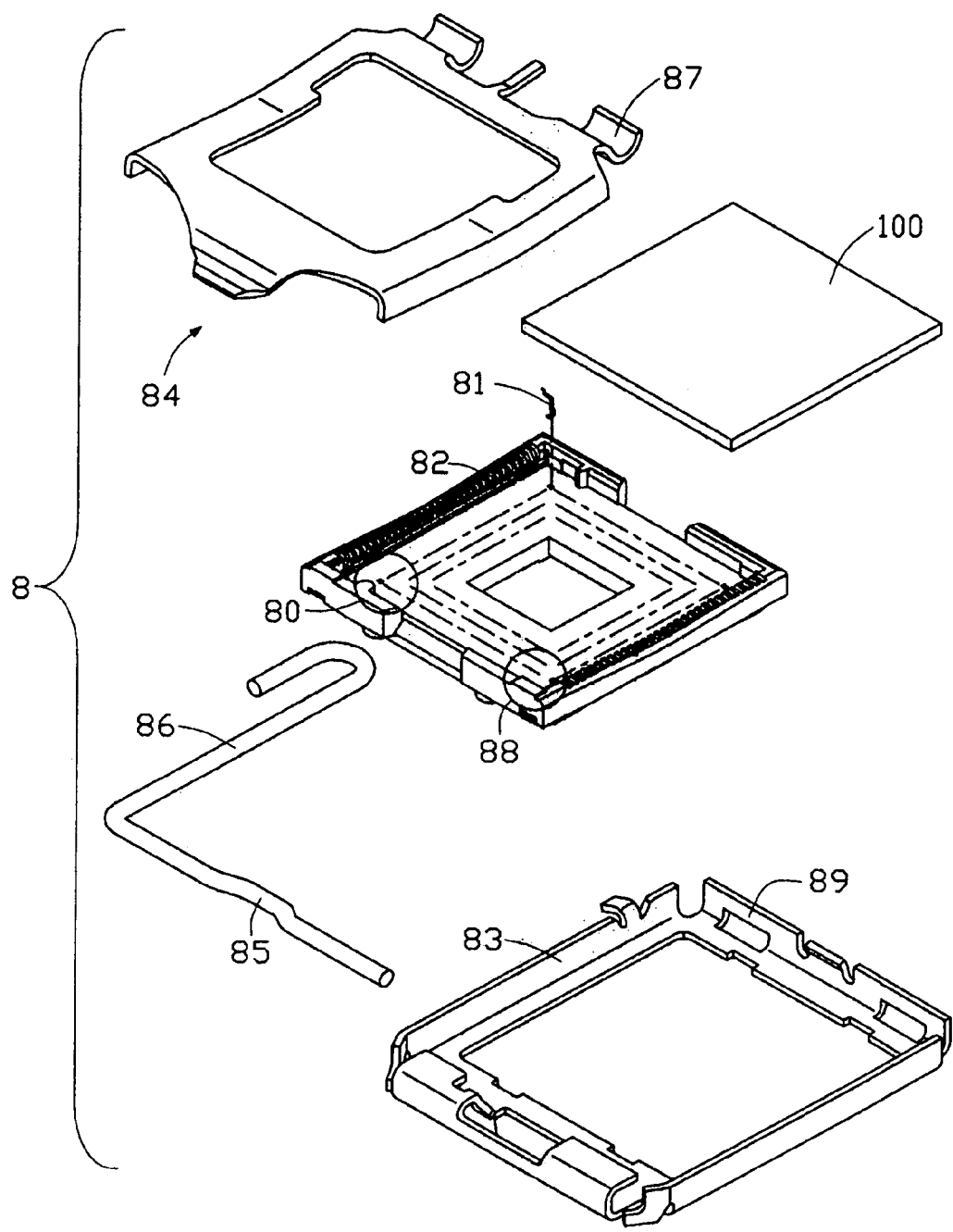
FIG. 5 is another assembled perspective view of the LGA connector assembly and the CPU of the FIG. 3, wherein the LGA connector assembly is in a close position.
Figure 6:
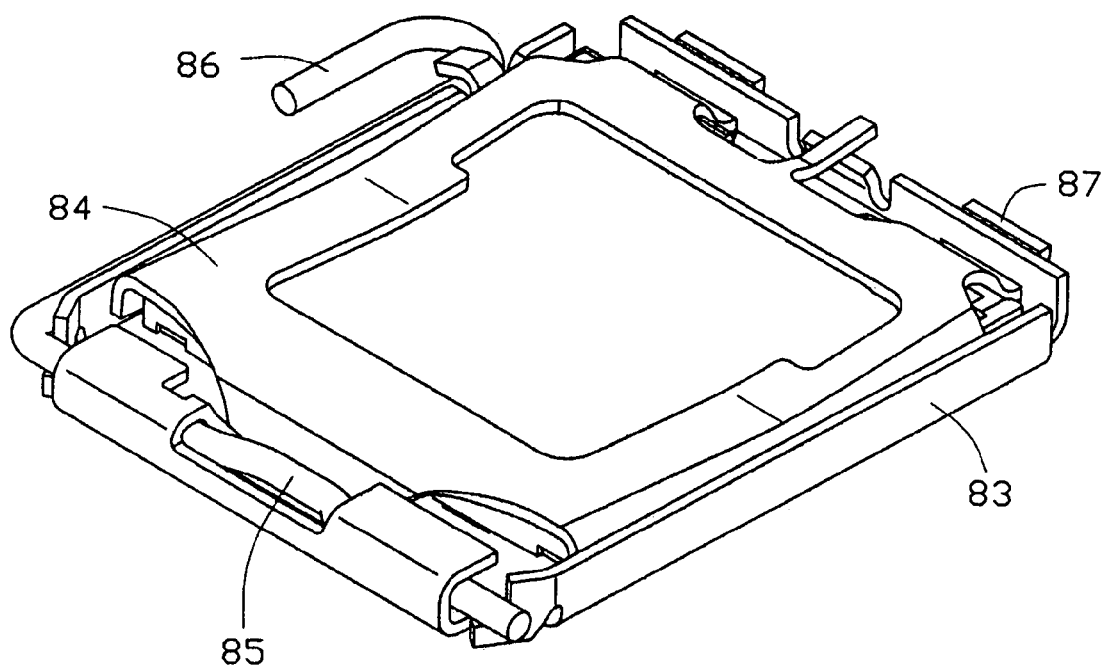
FIG. 6 is an exploded perspective view of another LGA connector assembly and the CPU in another embodiment in accordance with the present invention.

Referring to FIGS. 3–5, a land grid array (LGA) connector assembly in accordance with the present invention is adapted for electrically connecting an LGA central processing unit (CPU) 60 with a printed circuit board (PCB) (not shown).

The LGA connector assembly comprises an insulative frame 10, a plurality of contacts 12 received in the insulative frame 10, a reinforcement 20 covering a circumference of the insulative frame 10, a lever 30 and a clip 40 pivotally mounted to two opposite ends of the reinforcement 20 respectively.

The insulative frame 10 has an electric portion 14 in a center thereof with a mating face 15 in a top surface, a plurality of projections 18 on a bottom surface thereof and a guiding portion 19 located outside a sidewall thereof. The electric portion 14 is provided with a plurality of passages 16 for receiving corresponding contacts 12. Each contact 12 has an engaging portion (not labeled) extending beyond the mating face 15 to electrically connect with corresponding electrical pad (not shown) of the CPU 60 and a soldering portion (not shown) soldering on the PCB.

The lever 30 formed by bending a threadlike metal wire several times comprises an operating portion 32 and a locating portion 34 perpendicular to the operating portion 32. The operating portion 32 is formed with a handle portion 33 bended from a free end thereof, and the locating portion 34 is formed with an driving portion 35 at a center thereof.

The clip 40 is stamped and formed from a sheet of metallic material and formed a frame structure defining a space at a center thereof. The clip 40 comprise two opposite sides 41, 42, the side 41 is formed with an extending portion 411 extending outwardly from a middle part of an outside edge thereof, the side 42 is formed with a pair of symmetrical pivotal portions 421 with an arc cross section and a position portion 422 disposed between the pair of the pivotal portions 421 all extending outwardly from an outside edge thereof. The clip 40 is bend toward the insulative frame 10 at a central section thereof between the opposite sides 41, 42 to form an inverted arch figure with a pressing portion 43 protruding to the insulative frame 10. In use, the pressing portions 43 of the clip 40 is contacting with the CPU 60, when the driving portion 35 of the lever 30 presses the clip 40 downwardly, the pressing portions 43 of the clip 40 is brought to press the CPU 60 downwardly to make the CPU 60 electrically abut against the contacts 12 of the LGA connector assembly firmly. The metal clip 40 has a pair of hooked stopping portions 424 integrative with the pivotal portion 421, the stopping portions 424 are formed on a rear edge of the pivotal portion 421 near the side 42 of the metal clip 40 and bend toward insulative frame 10. Each pivotal portion 421 defines an outboard edge far away from the position portion 422 and an inboard edge adjacent the position portion 422. The stopping portions 424 are symmetrical and both formed on the outboard edge or the inboard edge of corresponding pivotal portion 421, or even the pivotal portion 421 is formed with a plurality of stopping portions 424 both on the outboard edge and the inboard edge thereof.

The reinforcement 20 comprises a rectangular bottom plate (not labeled) with a rectangular gap (not labeled) and four sidewalls extending upwardly from each edge of the bottom plate (not labeled). The sidewalls comprise a first sidewall 22 and a second sidewall 24 opposed to the first sidewall 22. The first sidewall 22 is formed with a pair of slots 221 engaging with the pivotal portion 421 of the clip 40 to pivotally assemble the clip 40 to the reinforcement 20. The second sidewall 24 is formed with a pair of inflexed blocking pieces 241 on a edge thereof and a driving piece 242 formed by bending a part of one of the blocking pieces 241. The blocking pieces 241, the driving 242 and the bottom plate define a space together to receive the locating portion 34 of the lever 30. Another sidewall of the reinforcement 20 near the operating portion 32 of the lever 30 is formed with a flange 243 to lock the lever 30. The reinforcement 20 further has a plurality of notches 26 on edges of the bottom plate to engaging with the projections 18 of the insulative frame 10.

In assembling the LGA connector assembly, the clip 40 and the lever 30 are pivotally mounted on the first sidewall 22 and the second sidewall 24 of the reinforcement 20 respectively, then the clip 40 is set at an open position relative to the reinforcement 20, the insulative frame 10 is put into the reinforcement 20 firmly by an engagement of the projections 18 thereof and the notches 26 of the reinforcement 20, simultaneity, the insulative frame 10 is surrounded by the sidewalls of the reinforcement 20.

In use, the LGA connector assembly is mounted to and electrically connected with the PCB. The clip 40 and the handle portion 33 of the lever 30 are each oriented perpendicular to the insulative frame 10, with the driving portion 35 disposed above the locating portion 34. The CPU 60 is received in the insulative frame 10 with metallic contact pads thereof loosely attaching on the corresponding contacts 12, at this time the stopping portions 424 of the clip 40 do not touch anything, that means the clip 40 can rotate freely at that position. And then the clip 40 is rotated downwardly to a horizontal position, following, the operating portion 32 of the lever 30 is rotated downwardly to an approximately horizontal position. When the driving portion 35 of the lever 30 reaches the extending portion 411 of the clip 40, the driving portion 35 drives the clip 40 downwardly by pressing the extending portion 411, that causes the pressing portion 43 of the clip 40 to press the CPU 60 downwardly and bring the electrical pads of the CPU 60 elastic colliding with the contacts 12. Finally the operating portion 32 is engaged under and locked by the flange 243 of the reinforcement 20, the driving portion 35 is fastened in a horizontal position and keeps the electrical pads of the CPU 60 elastic colliding with the contacts 12 tightly.

During the operating portion 32 of the lever being locked by the flange 243, the pivotal portion 421 of the clip 40 rotates along the guiding portion 19 of the insulative frame 10, and the clip 40 will move towards the driving portion 35 of the lever 30, that may also bring the CPU 60 moving together, but the clip 40 will not move unduly due to a existence of the stopping portions 424, the stopping portions 424 abut against the guiding portion 19 of the insulative frame 10 to prevent the CPU 60 from crushing or even damaging a sidewall of the insulative frame 10, and the stopping portion also decrease a friction between the CPU 60 and the sidewall of the insulative frame 10, so that the CPU 60 can electrically connect with the contacts 12 located at corners 17 of the insulative frame 10 reliably.

Referring to FIG. 4, it shows another embodiment of an land grid array (LGA) connector assembly in accordance with the present invention. The difference between this LGA connector assembly and the above LGA connector assembly is a bended direction of the hooked stopping portions 424' of the metal clip 40, the hooked stopping portions 424' are extending from an lateral side of the pivotal portion 421 and bend toward insulative frame 10 to abut against the insulative frame 10 when the clip 40 is in a close position.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulating frame;
   a plurality of contacts received in the insulative frame;
   a reinforcement covering a circumference of the insulative frame;
   a clip assembled on an end of the reinforcement and formed with at least one pivotal portion pivotally engaging with the reinforcement;
   a lever mounted to the other end of the reinforcement opposed to the clip and engaging with the clip to keep the clip in a horizontal position; wherein
   the pivotal portion of the clip has at least one stopping portion on a edge thereof abutting against the insulative frame to prevent the clip from moving flatly.

2. The electrical connector as described in claim 1, wherein each stopping portion is integrative with corresponding pivotal portion.

3. The electrical connector as described in claim 1, wherein the reinforcement has a pair of slots engaging with corresponding pivotal portions of the clip.

4. The electrical connector as described in claim 1, wherein the lever has an operating portion and a locating portion with a driving portion at a center thereof for pressing the clip.

5. The electrical connector as described in claim 1, wherein the clip has two pivotal portions each formed with a stopping portion.

6. The electrical connector as described in claim 5, wherein the insulative frame has a guiding portion opposite the pivotal portions of the clip, and the stopping portion is formed on a side of the clip near the guiding portion.

7. The electrical connector as described in claim 5, wherein the two stopping portions are disposed symmetrically.

8. The electrical connector as described in claim 7, wherein the two stopping portions are both formed on an inboard edge of corresponding pivotal portions.

9. The electrical connector as described in claim 7, wherein the two stopping portions are both formed on an outboard edge of corresponding pivotal portions.

10. The electrical connector as described in claim 9, wherein each stopping portion is hooked and bended towards the insulative frame.

11. An electrical connector comprising:
an insulative frame;
a plurality of contacts received in the insulative frame;
a reinforcement attached to the insulative frame;
a clip assembled on an end of the reinforcement and formed with at least one curved pivotal portion pivotally engaging with the reinforcement;
a lever mounted to another end of the reinforcement opposite to the clip and engaging with the clip to keep the clip in a horizontal position; wherein
the pivotal portion of the clip has at least one stopping portion abutting against the insulative frame to prevent the clip form moving toward the frame when the clip is located in the horizontal position and the lever presses a distal end of the clip.

12. The connector as claimed in claim 11, wherein said pivotal portion further includes another stopping portion to prevent the clip from moving away from the frame when the clip is located in the horizontal position and the lever presses a distal end of the clip.

13. The connector as claimed in claim 12, wherein said another stopping portion abuts against said end of the reinforcement when said clip is located in the horizontal position.

14. The connector as claimed in claim 13, wherein said end of the reinforcement defines a slot generally snugly receiving said pivotal portion therein, and said another stopping portion essentially extends laterally from a lateral side of the pivotal portion and can not extend through said slot.

15. The connector as claimed in claim 14, wherein said stopping portion and said another stopping portion are connected to each other in a lengthwise direction along which said end and said other end of the reinforcement are defined.

16. An electrical connector comprising:
an insulative frame;
a plurality of contacts received in the insulative frame;
a clip assembled on an end of the reinforcement and formed with at least one curved pivotal portion pivotally engaging with the reinforcement;
a lever mounted to another end of the reinforcement opposite to the clip and engaging with the clip to keep the clip in a horizontal position; wherein
the pivotal portion of the clip has at least one stopping portion laterally extending from the pivotal portion and abutting against the end of the reinforcement to prevent the clip from moving away from the frame when the clip is located in the horizontal position and the lever downwardly presses a distal end lacking end of the clip.

* * * * *